(12) United States Patent
Alfermann

(10) Patent No.: US 10,317,469 B2
(45) Date of Patent: Jun. 11, 2019

(54) BEARING FAULT DETECTION SYSTEM FOR AN ALTERNATOR

(71) Applicant: BorgWarner Inc., Auburn Hills, MI (US)

(72) Inventor: Timothy J. Alfermann, Pendleton, IN (US)

(73) Assignee: BORGWARNER INC., Auburn Hills, MI (US)

( * ) Notice: Subject to any disclaimer, the term of this patent is extended or adjusted under 35 U.S.C. 154(b) by 139 days.

(21) Appl. No.: 15/349,563

(22) Filed: Nov. 11, 2016

(65) Prior Publication Data

US 2018/0136282 A1 May 17, 2018

(51) Int. Cl.
*G01R 31/34* (2006.01)
*F16C 19/06* (2006.01)
*G01M 13/04* (2019.01)

(52) U.S. Cl.
CPC ............ *G01R 31/343* (2013.01); *F16C 19/06* (2013.01); *G01M 13/04* (2013.01); *F16C 2233/00* (2013.01); *F16C 2380/26* (2013.01)

(58) Field of Classification Search
CPC .................................................. H02K 19/365
See application file for complete search history.

(56) References Cited

U.S. PATENT DOCUMENTS

| 4,377,784 A | 3/1983 | Saito et al. |
| 2006/0214524 A1* | 9/2006 | Kashihara ............... H01R 39/58 310/68 D |
| 2008/0232005 A1 | 9/2008 | Kuehnle et al. |
| 2009/0218992 A1 | 9/2009 | Nagata et al. |
| 2012/0001580 A1 | 1/2012 | Zhang et al. |
| 2014/0107955 A1 | 4/2014 | Thompson et al. |

OTHER PUBLICATIONS

International Search Report for International Application No. PCT/US2017/059248, dated Feb. 20, 2018 (5 pp.).
Written Opinion of the International Searching Authority for International Application No. PCT/US2017/059248, dated Feb. 20, 2018 (7 pp.).

* cited by examiner

*Primary Examiner* — Clayton E. LaBalle
*Assistant Examiner* — Jas A Sanghera
(74) *Attorney, Agent, or Firm* — Cantor Colburn LLP

(57) ABSTRACT

An alternator system includes an alternator including a housing, a stator having a stator assembly fixedly mounted relative to the housing, and a rotor rotatably mounted relative to the housing. The stator assembly produces one or more phase voltages. A rotor fault detection system is electrically connected to the stator assembly. The rotor fault detection system is operable to detect a rotor fault condition based on a quality of the one or more phase voltages of the stator assembly. An output member is operable to provide a visual output indicating the rotor fault condition is present.

18 Claims, 5 Drawing Sheets

BEARING FAULT DETECTION SYSTEM FOR AN ALTERNATOR

BACKGROUND OF THE INVENTION

Exemplary embodiments pertain to the art of alternators and, more particularly, to a bearing fault detection system for an alternator.

Alternators include a number of components which, over time, may fail. Harsh operating environments, length of operation, and other factors may lead to failure of one or more alternator components. Failure of an alternator component could lead to an interruption in charging. If left undetected, the interruption in charging may prove to be inconvenient to a driver. Various systems exist to detect faults in electronic components of an alternator. Other systems exist which detect a lack of output. If a failure is detected, a warning is provided to the driver. Typically, the warning takes the form of an indicator light or a text message presented on a display.

BRIEF DESCRIPTION OF THE INVENTION

Disclosed is an alternator system including an alternator including a housing, a stator having a stator assembly fixedly mounted relative to the housing, and a rotor rotatably mounted relative to the housing. The stator assembly produces one or more phase voltages. A rotor fault detection system is electrically connected to the stator assembly. The rotor fault detection system is operable to detect a rotor fault condition based on a quality of the one or more phase voltages of the stator assembly. An output member is operable to provide a visual output indicating the rotor fault condition is present.

Also disclosed is a method of detecting alternator faults including monitoring one or more phase voltages output from the alternator, detecting a change in signal quality of the one or more phase voltages indicative of a rotor fault condition, and outputting an alert indicating a presence of the rotor fault condition based on the change in signal quality.

BRIEF DESCRIPTION OF THE DRAWINGS

The following descriptions should not be considered limiting in any way. With reference to the accompanying drawings, like elements are numbered alike.

DETAILED DESCRIPTION OF THE INVENTION

A detailed description of one or more embodiments of the disclosed apparatus and method are presented herein by way of exemplification and not limitation with reference to the Figures.

Figure 1:
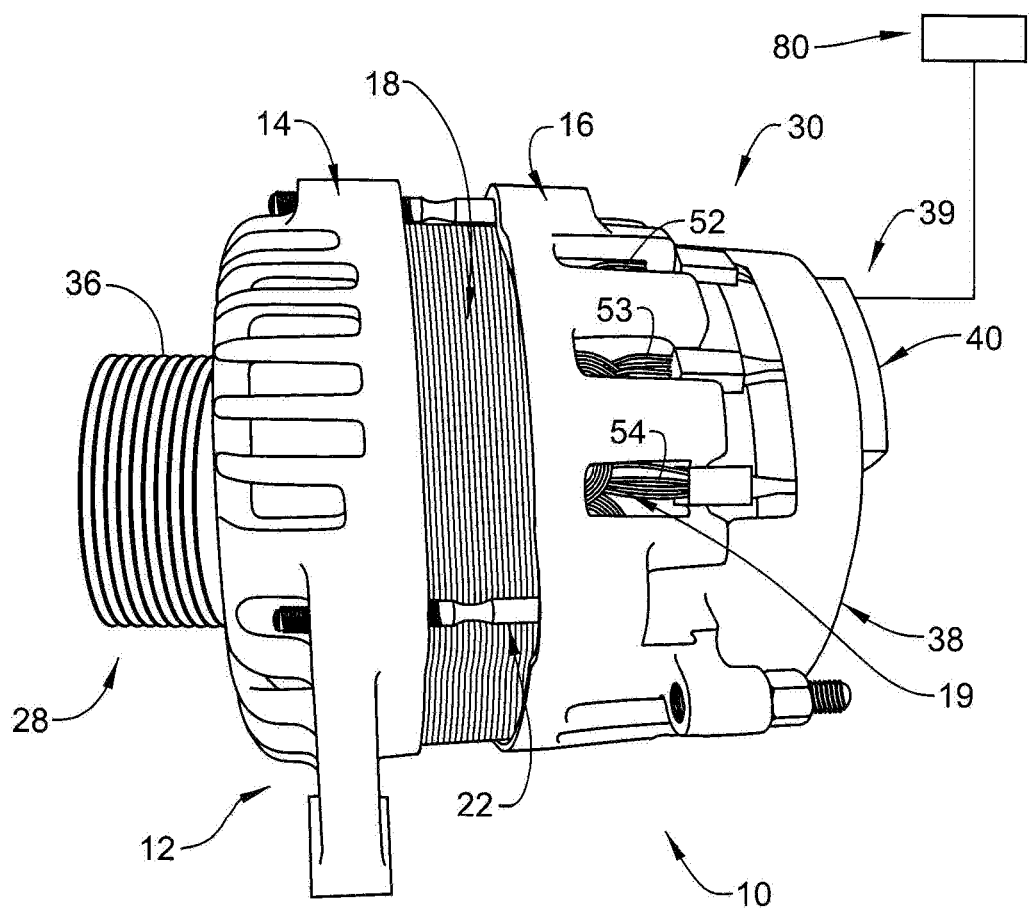
FIG. 1 depicts an alternator including a rotor fault detection system, in accordance with an exemplary embodiment.
Figure 2:
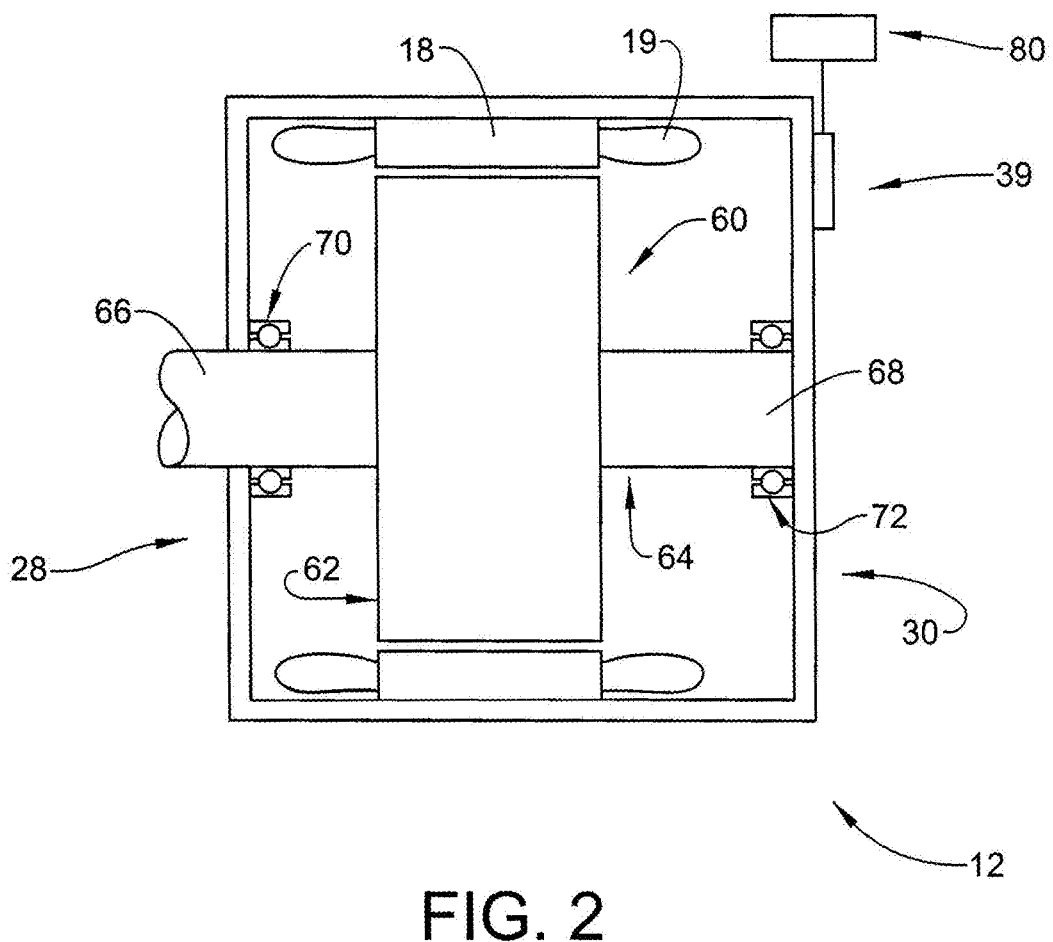
FIG. 2 depicts a cross-sectional view of the alternator of FIG. 1.

An alternator system, in accordance with an exemplary embodiment, includes an alternator indicated generally at 10 in FIGS. 1 and 2. Alternator 10 includes a housing 12 having a first housing portion 14 and a second housing portion 16. First and second housing portions 14 and 16 cover, at least in part, opposing ends (not separately labeled) of a stator assembly 18 that supports one or more windings 19. A plurality of mechanical fasteners, one of which is indicated at 22 join first and second housing portions 14 and 16 sandwiching stator assembly 18 therebetween.

Alternator 10 includes a driven end 28 and a load or output end 30. Driven end 28 includes a pulley 36 that may be driven by a belt (not shown) associated with a prime mover, such as an engine (also not shown). Output end 30 includes a cover 38 that may support an output system 39 that may take the form of a voltage regulator 40 that controls an electrical output by controlling field coil current inducing voltage in stator assembly 18 to charge a battery (not shown). The electrical output may pass through one or more stator coils 52, 53, and 54 in the form of first, second and third phase voltages. Of course, it should be understood that the number of phase voltages produced by alternator 10 may vary.

A rotor 60 is rotatably supported in housing 12 relative to stator 18. Rotor 60 includes a rotor winding 62 and is supported by a shaft 64 having a first or driven end 66 coupled to pulley 36 and a second end 68. First end 66 is supported at driven end 28 of housing 12 by a first bearing 70. Second end 68 is supported at output end 30 through a second bearing 72. Over time, first and/or second bearing 70, 72 may fail leading to an impediment to rotation of rotor 60. The impediment to rotation may also lead to undesirable contact between rotor windings 62 and stator windings 19 which, if left unchecked, will lead to an operational failure of alternator 10.

Figure 3:
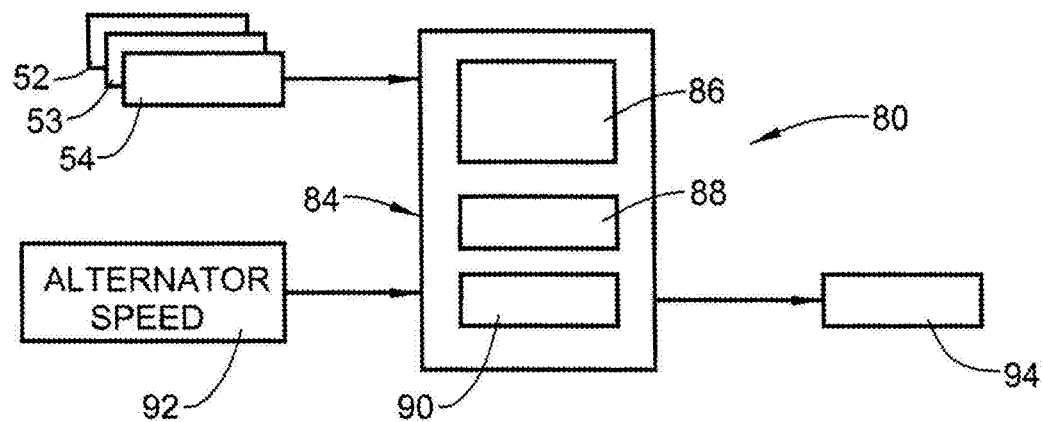
FIG. 3 depicts a block diagram illustrating the rotor fault detection system, in accordance with an exemplary embodiment.

In accordance with an aspect of an exemplary embodiment illustrated in FIG. 3, output system 39 is electrically coupled to a rotor fault detection system 80. Rotor fault detection system 80 is operable to detect a rotor fault condition of rotor 60 based on a quality of the one or more phase voltages produced by alternator 10. Specifically, rotor fault detection system 80 may detect a faulty bearing that may cause a rubbing of rotor 60 and stator 18 or other anomalies indicating that one or more of first and second bearings 70, 72 may be failing. The term "rotor rubbing condition" should be understood to describe a condition of rotor 60 that may result in a corruption to output signals. The corruption, if left unchecked, could result in alternator failure.

In accordance with an aspect of an exemplary embodiment, rotor fault detection system 80 includes a fault detection module 84 having a processor 86, a memory 88 and a phase voltage monitoring module 90. Rotor fault detection system 80 may also include an alternator speed input 92 that senses an operation speed of alternator 10. In this manner, rotor fault detection system 80 may monitor for faults by comparing a phase voltage waveform to an ideal or expected phase voltage waveform at a selected speed.

Phase voltage monitoring module 90 evaluates a quality of the one or more phase voltages output from alternator 10 to determine whether a fault condition exists. If a fault detection is detected, an alert may be provided through an output member 94 warning a user of a possible maintenance requirement or other action. The alert may be a visual alert, and/or an audible alert provided to a user. It should be understood that the term "quality of the one or more phase voltages" describes a signal quality of the one or more phase voltages output by alternator 10. It is to be understood that "signal quality" may be evaluated to determine the existence of signal anomalies which lead to a conclusion that a fault condition has developed. It is to be understood that the term "signal anomalies" describes undesirable or abnormal signal attributes.

Figure 4:
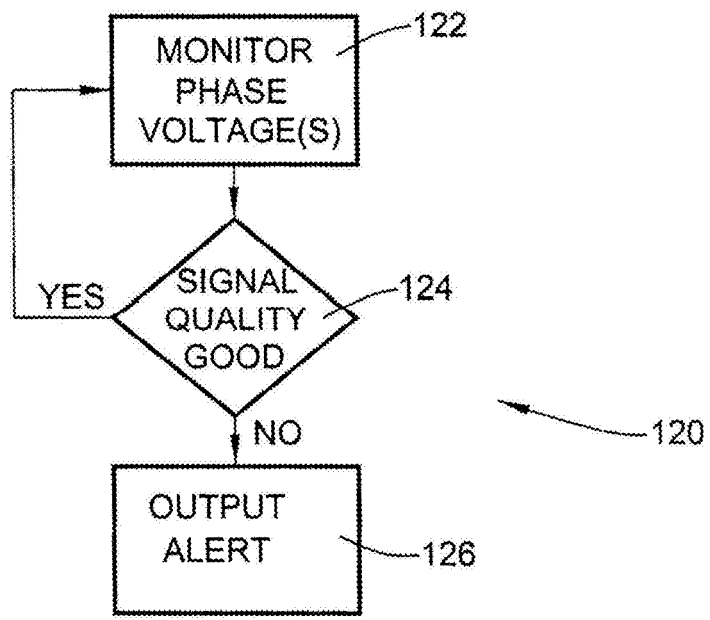
FIG. 4 depicts a flow diagram illustrating a method of detecting rotor failure, in accordance with an aspect of an exemplary embodiment.

FIG. 4 depicts a method 120 of detecting rotor faults in accordance with an aspect of an exemplary embodiment. In block 122, rotor fault detection system 80 monitors the one or more phase voltages output from alternator 10. In block 124, rotor fault detection system 80 determines whether output signal quality is acceptable. If output signal quality is not acceptable, an alert may be provided in block 126. The alert may be a visual output in the form of a warning light, a text based message or the like. An audible alert may take the form of a tone, a simulated voice or the like. The alert may be output in the event that a number of fault conditions exceed a predetermined number of faulty signals for a selected time duration.

Figure 5:
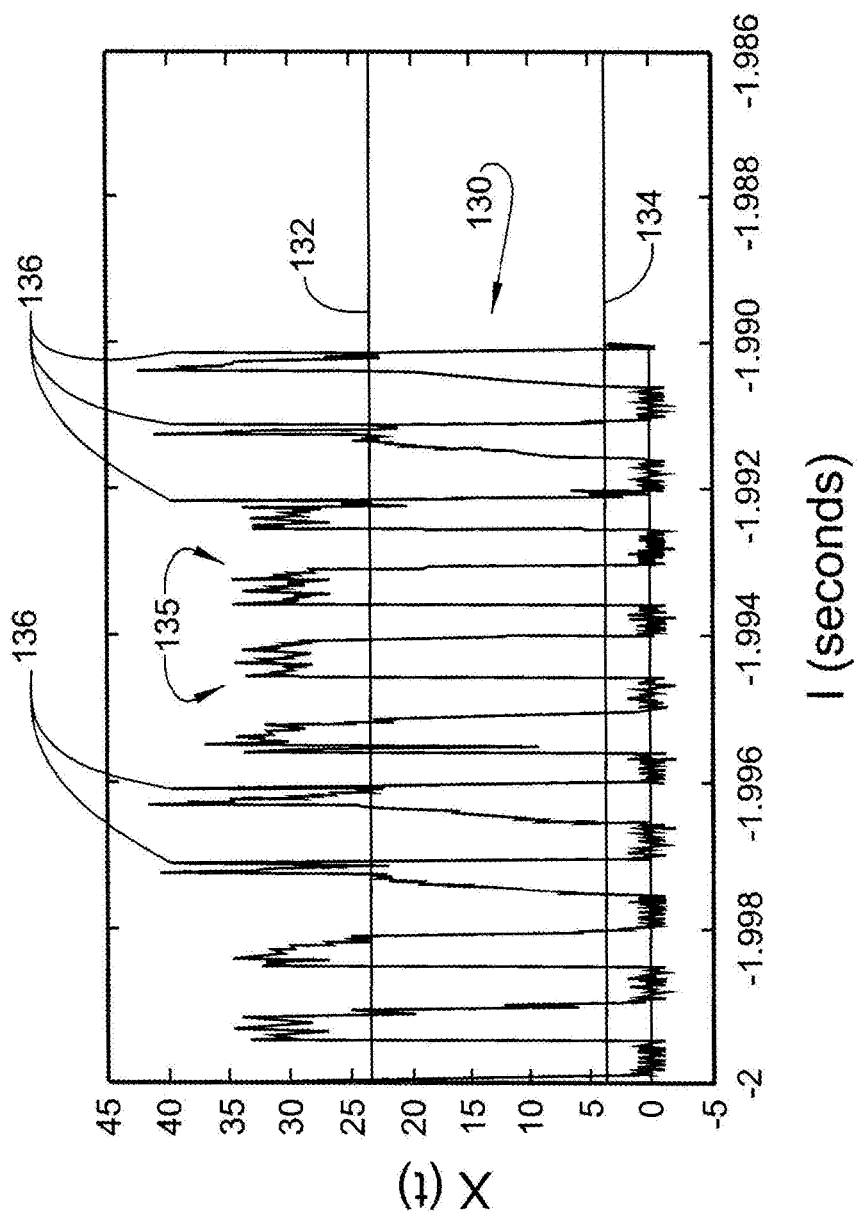
FIG. 5 depicts a graph illustrating output phases employed by the rotor fault detection system to determine a rotor failure, in accordance with an aspect of an exemplary embodiment.

In accordance with an aspect of an exemplary, phase voltage monitoring module 90 may implement a HI/LO mismatch review as shown in FIG. 5. In a HI/LO mismatch review, a HI value 132 may be set at a first voltage value and a LO value 134 may be set at a low voltage value. The HI value 132 may represent a value that is slightly lower than nominal output voltage of alternator 10 and the LO value 134 may represent a voltage value near zero volts. In the HI/LO mismatch review, a time duration a signal exists at HI value 132 is compared against a time duration the signal exists at LO value 134. If the time durations are substantially similar, such as with signals 135, no fault condition is seen to exist. However, if signals such as those shown at 136, having a time duration at HI value 132 that is different from the time duration at LO value 134 are detected, a fault condition is indicated.

In accordance with an aspect of an exemplary embodiment, if there is a rotor fault condition may be indicated based on a percent difference between a time duration for a first predetermined voltage value, e.g., HI value 132 and a time duration for a second predetermined voltage value, e.g., LO value 134. In accordance with an exemplary aspect, a fault condition may exist if the percent difference is between about 5% and 40%. In accordance with another exemplary aspect, a rotor fault condition may exist if the percent difference is no more than about 30%. In accordance with yet another exemplary aspect, a rotor fault condition may exist if the percent difference is about 10%.

Figure 6:
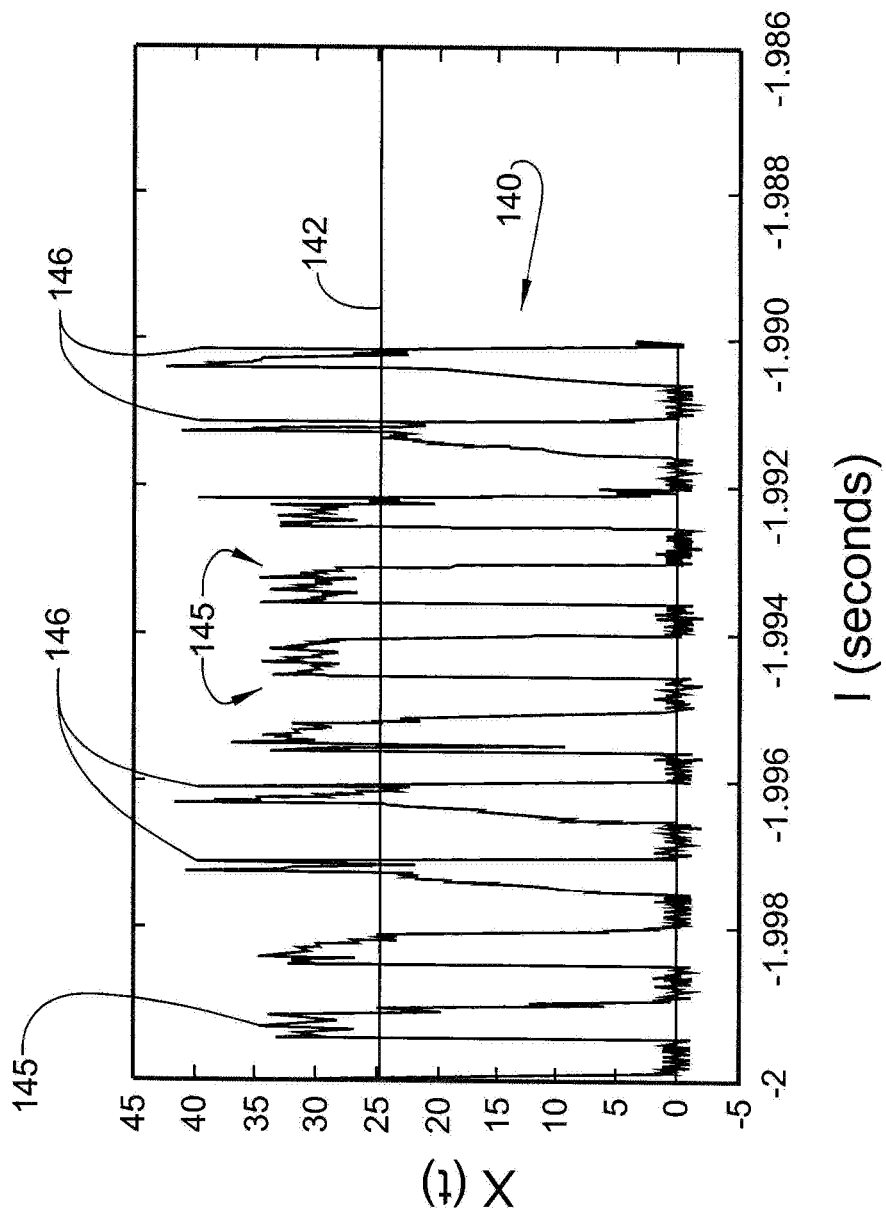
FIG. 6 depicts a graph illustrating output phases employed by the rotor fault detection system to determine a rotor failure, in accordance with another aspect of an exemplary embodiment

In accordance with another aspect of an exemplary embodiment, phase voltage monitoring module 90 may implement a HI time voltage vs. expected frequency review 140 as shown in FIG. 6. The phrase "HI time" should be understood to describe a time duration a signal exists at a desired voltage level, such as slightly lower than nominal output, during a single cycle. In the HI Time Voltage vs. Expected Frequency review, a HI value 142 may be set at a voltage value that may represent a nominal output of alternator 10. Rotor fault detection system 80 evaluates a time duration a signal exists at HI value 142. A voltage value may be compared against an expected time value that may be stored in memory 88. If the time duration is as expected, such as seen in signals 145, no fault condition is seen to exist. However, if signals such as shown at 146, having a time duration at HI value 142 that is different from what which is expected, a fault condition is indicated.

Expected HI time value may be derived from prime mover (engine) speed and a relationship through a pulley ratio and machine pole count to phase frequency. HI value 142 should be consistent with the expected time value at a given frequency.

It is to be understood that exemplary embodiments provide a system for detecting an alternator fault condition based on signal quality. That is, in contrast to prior art systems in which a fault is indicated based on an absence of output, or a non-nominal output, the exemplary embodiments can detect a fault even when output voltage is at desired levels and differentiate between other failure modes. Detecting faults early may provide a user with time to initiate a maintenance cycle before being stranded by a power loss. Identifying bearing failure modes can help limit failure severity by taking appropriate action.

The terms "about" and "substantially" are intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims.

What is claimed is:

1. An alternator system comprising:
an alternator including a housing, a stator having a stator assembly fixedly mounted relative to the housing, and a rotor rotatably mounted relative to the housing, the stator assembly producing one or more phase voltages;
a rotor fault detection system electrically connected to the stator assembly, the rotor fault detection system being operable to detect a mechanical rotor fault condition based on a comparison of a HI voltage time duration to another value of the one or more phase voltages of the stator assembly; and
an output member operable to provide a visual output indicating the mechanical rotor fault condition is present.

2. The alternator system according to claim 1, wherein the mechanical rotor fault detection system determines whether a corruption of the one or more phase voltages exists.

3. The alternator system according to claim 2, wherein the corruption indicates contact between the rotor and the stator.

4. The alternator system according to claim 2, wherein the corruption results from a faulty bearing rotatably supporting the rotor relative to the stator.

5. The alternator system according to claim 1, wherein the rotor fault detection system includes a phase voltage monitoring module operable to detect a quality of the one or more phase voltages from the alternator.

6. The alternator system according to claim 5, wherein the phase voltage monitoring module detects a phase voltage waveform of the one or more phase voltages.

7. A method of detecting alternator faults comprising:
monitoring one or more phase voltages output from the alternator;
comparing a HI voltage time duration to another value of the one or more phase voltages to identify a mechanical rotor fault condition; and
outputting an alert indicating a presence of the mechanical rotor fault condition based on the comparison of the HI voltage time duration to the another value.

8. The method of claim 7, wherein detecting the mechanical rotor fault condition includes determining the presence of contact between a rotor and a stator.

9. The method of claim 7, wherein detecting the mechanical rotor fault condition includes detecting a faulty bearing rotatably supporting the rotor.

10. The method of claim 7, wherein comparing the HI voltage time duration to the another value includes sensing a change in a phase voltage waveform.

11. The method of claim 7, wherein comparing the HI voltage time duration to the another value includes indicating a faulty signal based on a percent difference between a time duration for a first predetermined voltage value and a time duration for a second predetermined voltage value.

12. The method of claim 11, wherein the percent difference is between about 5% and 40%.

13. The method of claim 12, wherein the percent difference is no more than about 30%.

14. The method of claim 13, wherein the percent difference is about 10%.

15. The method of claim 7, wherein outputting the alert includes presenting the alert if there are a predetermined number of faulty signals in a selected time duration.

16. The method of claim 7, wherein comparing the HI voltage time duration to the another value includes indicating a faulty signal based on a deviation from an expected phase voltage waveform at a selected speed.

17. The method of claim 16, wherein outputting the alert includes presenting the alert if there are a predetermined number of faulty signals in a selected time duration.

18. The method of claim 7, wherein monitoring the one or more phase voltages output from the alternator includes detecting one or more phase voltages produced at a selected speed.

* * * * *